United States Patent [19]

Brown et al.

[11] Patent Number: 4,873,219

[45] Date of Patent: Oct. 10, 1989

[54] DESENSITIZABLE SELF-CONTAINED RECORD MATERIAL USEFUL FOR SECURITY DOCUMENTS AND THE LIKE

[75] Inventors: Robert W. Brown; Donald Churchill, both of Appleton, Wis.

[73] Assignee: Appleton Papers Inc., Appleton, Wis.

[21] Appl. No.: 271,472

[22] Filed: Nov. 15, 1988

[51] Int. Cl.[4] .......................... B41M 5/16; G03C 1/72
[52] U.S. Cl. .................................... 503/204; 428/913; 430/138; 503/215; 503/226
[58] Field of Search .................. 427/150–152; 428/913, 194; 430/138; 503/204, 215, 217, 216, 218, 220, 221, 226

[56] References Cited

U.S. PATENT DOCUMENTS

| | | | |
|---|---|---|---|
| 4,440,846 | 4/1984 | Sanders et al. | 430/138 |
| 4,576,891 | 3/1986 | Adair et al. | 430/138 |
| 4,760,048 | 7/1988 | Kurihara et al. | 503/204 |

*Primary Examiner*—Bruce H. Hess

*Attorney, Agent, or Firm*—Benjamin Mieliulis

[57] ABSTRACT

An improved self-contained record material having tamper resistance through an indicator quality is disclosed. The self-contained record material of the invention is suitable for forming a visible mark with a focussed means of pressure application such as a stylus, needle, or pen and which mark can then later be in part fixed by unfocussed light. The self-contained record material comprises a substrate on which is coated two sets of microcapsules only one of which is made photosensitive to change in viscosity upon exposure to actinic radiation, and the first of which are conventional microcapsules. The color formers in each of the sets of microcapsules are selected to express a different observed color. Original markings, for example, could be black (combination of the orange and blue color formers). After exposure to actinic radiation desensitizing the blue color former containing capsules, subsequent markings are orange indicating the aspect of the subsequence in time.

9 Claims, No Drawings

DESENSITIZABLE SELF-CONTAINED RECORD MATERIAL USEFUL FOR SECURITY DOCUMENTS AND THE LIKE

BACKGROUND OF INVENTION

1. Field of Invention

This invention relates to carbonless record materials. It more particularly relates to pressure-sensitive record materials in the form of self-contained carbonless record sheets.

Self-contained pressure-sensitive record materials is a type of pressure-sensitive manifold sheet, usually paper, wherein a color-forming reaction is used between an electron donating chromogenic material (color former) and an electron accepting coreactant (developer). The record sheet can be formed by coating a substrate with a layer of microcapsules enclosing an oily solution having a color former dissolved or dispersed therein and with another layer of a developer. Usually the acidic developer layer is formed over the color former microcapsule layer. An alternate construction is to coat a substrate with a mixture of microcapsules and acidic developer in a single layer interspersed on the same substrate, which can be accomplished in a single coating step.

2. Description of Related Art

Self-contained record materials are described in general, for example, in U.S. Pat. Nos. 4,197,346; 4,486,762 and 4,680,597. Also in United Kingdom Pat. No. 1,215,618. U.S. Pat. No. 4,197,346 describes self-contained pressure-sensitive record materials comprising an oil-soluble phenol-formaldehyde novolak resin or an oil-soluble metal salt of a phenol-formaldehyde novolak resin as a color-developer. British Pat. No. 1,215,618 teaches self-contained record materials containing a solution of chromogenic material and a top coating comprising a mixture of kaolin clay and an oil-soluble phenol-formaldehyde novolak resin.

Various configurations comprising a self-contained, single coating of color-forming reactant material have been proposed in the prior art. U.S. Pat. No. 3,576,660 discloses a pressure-sensitive record sheet having encapsulated color-forming co-reactants in a single coating layer. In this system, one group of capsules contains an oily solution of a chromogenic material and a second group of capsules contains an oily solution of phenolic polymeric material. Special capsule wall materials are taught used to help solve the problem of premature coloration caused by the close proximity of the color-forming reactants in the single layer.

Each of U.S. Pat. Nos. 2,929,736; 3,481,759 and 3,672,935 discloses a coated mixture of encapsulated chromogenic materials and unencapsulated solid particles. The chromogenic materials and the solid particles react with each other to form a colored mark when they are brought into contact. More specifically, U.S. Pat. No. 2,929,736 discloses a heat and pressure-sensitive record sheet having an encapsulated liquid chromogenic solution, solid co-reactive clay praticles and a polymeric film-forming protective material, all mixed together to yield a single, color-forming coating layer. U.S. Pat. No. 3,481,759 discloses single-coating, self-contained pressure-sensitive record material having a color-forming layer of capsules containing a liquid solution of color reactant, polymeric binder material and metal resinate coreactant particles. U.S. Pat. No. 3,672,935 teaches several forms of pressure-sensitive record material including self-contained sheets wherein an encapsulated liquid solution of one co-reactant and solid particles of another co-reactant can be combined in a single coating layer. In one embodiment, capsules of an oily solution of co-reactant are combined with unencapsulated solid particles of chromogenic compounds and, in another embodiment, capsules of oily solvent are combined with unencapsulated solid particles of chromogenic compounds and coreactant.

A drawback of self-contained papers is that imaging capability continues essentially unaltered after the first use. Subsequent in time imaging is not readily detectable as having occurred after the first imaging or marking. Self-contained papers have found little usefulness as security documents where tamper resistance is important.

More recently pressure-sensitive copying sheets principally transfer sheets using radiation curable coatings have been disclosed by such patents as U.S. Pat. Nos. 4,091,122; 4,110,511; 4,137,094 and 4,751,165. Photosensitive microcapsules and systems utilizing them are disclosed in U.S. Pat. Nos. 4,587,194 and 4,600,678. Transfer systems using photosensitive microcapsules have been marketed as the Cycolor process. The process uses a sandwich configuration and involves a donar substrate coated with three kinds of microcapsules, each sensitive to one of the primary colors. In response to projection of an image the capsules harden proportionate to the exposure to the appropriate color of light. The exposed substrate in contact with a developer ply is run through pressure rollers. Capsules not completely hardened are ruptured thereby to produce a color imgage on the receiver developer ply.

It is an object of the present invention to disclose a self-contained record sheet having improved tamper resistance by making subsequent-in-time imaging or marking detectable as such.

SUMMARY OF THE INVENTION

An improved self-contained record material is disclosed. In self-contained record materials, an acidic developer and microcapsules containing a color-former of chromogen are coated as one or more layers on a sheet. Pressure exerted by writing or typing causes the capsules to rupture and release the chromogenic material which then reacts with co-reactant on the sheet to produce color.

In the present invention, a self-contained sheet having tamper resistance is disclosed. The self-contained record material is of the above type having a substrate, a coating on the substrate comprising an acidic developer material and a first set of microcapsules containing a color former, wherein the improvement comprises including in addition a second set of microcapsules containing a second color former and a photosensitive composition internal thereof which second set of microcapsules undergoes a change in viscosity upon exposure to actinic radiation. Preferably, the second color former is visually detectably different from the first color former.

DETAILED DESCRIPTION

The present invention comprises a tamper resistant self-contained record material comprising a substrate on which is coated in one (or more than one layer) at least two sets of microcapsules. The first set of microcapsules contains a color former and include photosensitive compositions internal thereof which undergo a change in viscosity upon exposure to actinic radiation. The second set of microcapsules are conventional microcapsules used in carbonless systems. They contain a color former but do not include a photosensitive composition. Preferably the color formers in the two sets of microcapsules are different. An acidic developer material is provided outside the microcapsules interspersed therewith or provided as an overcoat layer.

The above combination gives rise to novel types of multi-color self-contained record material. The resultant self-contained record material can have multiple shading capabilities, and more importantly can have multiple color capabilities. More specifically, one capsule can be loaded, for example, with an orange color former, photoinitiator and a polymerizing solvent. The other capsule can be loaded with a blue color former, a nonpolymerizing solvent, and no photoinitiator. Original markings would appear black (the combination of the orange and blue). Upon exposure to actinic radiation, the capsules holding orange polymerize. All subsequent markings would be blue only. This paper would offer security against tampering or changes.

An alternate configuration but with less of the security aspect would be to assemble a self-contained record sheet as set forth above but with only one set of microcapsules and which microcapsules are photosensitive. This self-contained record material would function as a carbonless record material until such time as exposed to actinic radiation which would shut the system down. Present day self-contained papers continue to image after first use thus with age develop substantial interfering background coloration from handling forces.

The photosensitive mirocapsules used in the present invention can be prepared by following the teachings in U.S. Pat. Nos. 4,399,209 and 4,440,846, both of which are incorporated by reference.

The preferred photosensitive microcapsules useful in the present invention are photohardenable compositions which increase in viscosity. Photosoftenable compositions can probably also be used.

A typical example of a photohardenable composition useful in the present invention is ethylenically unsaturated compounds. These compounds contain at least one terminal ethylene group per molecule. Liquid ethylenically unsaturated compounds having two or more terminal ethylene groups per molecule are generally preferred. Examples of this preferred subgroup are ethylenically unsaturated acid esters of polyhydric alcohols such as ethyleneglycol dimethacrylate, triethylene glycol dimethacrylate, trimethylolpropane triacrylate (TMPTA), trimethylol propane trimethacrylate, pentaerythritol triacrylate, pentaerythritol trimethacrylate, etc.

A photosoftenable material that may be useful in the invention is 3-oximino-2-butanone methacrylate which undergoes main chain scission upon U.V. exposure, poly 4'-alkyl acylophenones, and certain resins having a quinone diazide residue. See Reichmanis, E.; Am. Chem. Soc. Div. Org. Coat. Plast. Chem. Prepr. 1980. 43, 243–251 and Lukac, I.; Chmela S., Int. Conf. on Modif. Polym. 5th. Bratislave, Czech. July 3–6, 1979, I.U.P.A.C. Oxford, England 1979, 1, 176–182.

Photoinitiators which form free-radicals by homolytic bond clevage after photoexcitation or photoinitiators which generate a free-radical by abstraction of a hydrogen atom from a suitable hydrogen donor upon photoexcitation can be used. If a system which relies upon ionic polymerization is used, the photoinitiator may be the anion or cation generating type, depending on the nature of the polymerization.

Examples of photoinitiators useful in the present invention include diaryl ketone derivatives and benzoin alkyl ethers. The photoinitiator is selected based on the sensitivity of the system that is desired. Where ultraviolet sensitivity is desired, suitable photoinitiators include alkoxy phenyl ketones, O-acylated oximinoketones, polycyclic quinones, benzophenones, substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes. In many cases it is advantageous to use a combination of photoinitiators. For ultraviolet sensitivity one desirable combination is 2,2'-dimethoxy-2-phenylacetophenone, isopropylxanthone and ethyl para-dimethylaminobenzoate. An initiator system including Michler's ketone and benzoin methyl ether was preferred.

The amount of photoinitiator used in the photosensitive composition will depend on the particular photosensitive material selected. The photoinitiator may be used to sequester oxygen which is present in the microcapsules and inhibits photopolymerization. In this case a non-imaging, oxygen sequestering pre-exposure or co-exposure is used.

Processes of microencapsulation are now well known in the art. The following process can be used to form conventional microcapsules (referred to as the first set of microcapsules in the appended claims). U.S. Patent No. 2,730,456 describes a method for capsule formation. Other useful methods for microcapsule manufacture are: U.S. Patent Nos. 4.001,140; 4.081,376 and 4.089,802 describing a reaction between urea and formaldehyde; U.S. Patent No. 4,100,103 describing reaction between melamine and formaldehyde; British Pat. No. 2,062,570 describing a process for producing microcapsules having walls produced by polymerization of melamine and formaldehyde in the presence of a styrenesulfonic acid. Microcapsules in a self-contained system are taught in U.S. Pat. Nos. 2,730,457 and 4,197,346. In a self-contained system, microcapsules containing a chromogenic material solution, and an acid developer material, are coated on the same surface of a sheet of paper. Pressure exerted by writing or typing causes the capsules to rupture and release the chormogenic material, which then reacts with co-reactant on the sheet to produce color. The more preferred processes for forming microcapsules are from urea-formaldehyde resin and/or melamine formaldehyde resin as disclosed in U.S. Pat. Nos. 4,001,140; 4,081,376, 4,089,802; 4,100,103; 4,105,823; 4,444,699 or 4,552,811.

The imaging material of the present invention can be used to form dye, toner or pigment images, however, a preferred example of an image-forming agent is colorless electron donating compounds which form color by reacting with a developer material. Representative examples of such compounds include substantially colorless compounds having a lactone, a lactam, a sulfone, a spiropyran, an ester or an amido structure in their partial skeleton such as triarylmethane compounds, bisphenylmethane compounds, xanthene compounds, fluorans, thiazine compounds, spiropyran compounds and the like.

Eligible chromogenic compounds, useful as color formers in the two sets of microcapsules include compounds such as the phthalide, leucauramine and fluoran compounds, which are well known color-forming compounds. Examples of color formers include Crystal Violet Lactone (3,3-bis(4-dimethylaminophenyl)-6-dimethylaminophthalide, U.S. Pat. No. Re. 23,024) )3,3-bis(4-diethylaminophenyl)-6-dimethylaminophthalide,; phenyl-, indol-, pyrrol-, and carbazol-substituted phthalides (for example, in U.S. Patent Nos. 3,491,111; 3,491,112; 3,491,116; 3,509,174); nitro-, amino-, amido-, sulfonamido-, aminobenzylidene-, halo-, anilino-substituted fluorans (for example, in U.S. Pat. Nos. 3,624,107; 3,627,787; 3,641,011; 3,642,828; 3,681,390); spirodipyrans (U.S. Pat. No. 3,971,808); and pyridine and pyrazine compounds (for example, in U.S. Pat. Nos. 3,775,424 and 3,853,869). Other specifically eligible chromogenic compounds, not limiting the invention in any way, are: 3-diethylamino-6-methyl-7-anilino-flouran (U.S. Pat. No, 3,681,390); 2-anilino-3-methyl-6-dibutylamino-fluoran (U.S. Pat. 4,510,513) also known as 3-dibutylamino-6-methyl-7-anilino-fluoran; 3-dibutylamino-7-(2-chloroanilino)fluoran; 3-(N-ethyl-N-tetrahydrofurfurylamino)-6-methyl-7-3,5',6-tris(dimethylamino)spiro[9H-fluorene-9,1'(3'H)-isobenzofuran]-3'-one; 7-(1-ethyl-2-methylindol-3-yl)-7-(4-diethylamino-2-ethoxyphenyl)-5,7-dihydrofuro[3,4-b]pyridin-5-one (U.S. Pat. No. 4,246,318); 3-diethylamino-7-(2-chloroanilino)fluoran (U.S. Pat. No. 3,920,510); 3-(N-methylcyclohexylamino)-6-methyl-7-anilinofluoran (U.S. Pat. No. 3,959,571); 7-(1-octyl-2-methylindol-3-yl)-7-(4-diethylamino-2-ethoxyphenyl)-5,7-dihydrofuro[3,4-b]pyridin-5-one; 3-diethylamino-7,8-benzofluoran; 3,3-bis(1-ethyl-2-methylindol-3-yl)phthalide; 3-diethylamino-7-dibenzylamino-2,2'-spiro-di-[2H-1-benzopyran]and mixtures of any of the following.

Examples of eligible acidic developer material include: clays; treated clays (U.S. Pat. Nos. 3,622,364 and 3,753,761); aromatic carbozylic acids such as salicyclic acid; derivatives of aromatic carboxylic acids and metal salts thereof (U.S. Pat No. 4,022,936); phenolic developers (U.S. Pat. Nos. 3,244,550 and 4,573,063); acidic polymeric material such as phenol-formaldehyde polymers, etc. (U.S. Pat. Nos. 3,455,721 and 3,672,935); and metal-modified phenolic resins (U.S. Pat. Nos. 3,732,120; 3,737,410; 4,165,102; 4,165,103; 4,166,644 and 4,188,456).

A liquid solvent is conventionally employed in the first set of microcapsules and can be any material which has sufficient solubility for the color former material, which is liquid within the temperature range at which carbonless copy paper is normally used and which does not suppress or otherwise adversely affect the color-forming reaction. Examples of eligible liquids include, but are not limited to, those solvents conventionally used for carbonless copy paper, including ethyldiphenylmethane (U.S. Pat. No. 3,996,405); benzyxylenes (U.S. Pat. No. 4,130,299); alkylbiphenyls such as propylbiphenyl (U.S. Pat. Nos. 3,627,581 and butylbiphenyl (U.S. Pat No. 4,287,074); dialkylphthalates in which the alkyl groups thereof have from 4 to 13 carbon atoms, e.g. dibutyl phthalate dioctylphthalate, dinonyl phthalate and ditridecylphthalate; 2,2,4-trimethyl-1,3-pentanediol diisobutyrate (U.S. Pat. No. 4,027,065); $C_{10}$–$C_{14}$ alkyl benzenes such as dodecyl benzene; alkyl or aralkyl benzoates such as benzyl benzoate; alkylated naphthalenes such as dipropylnaphthalene (U.S. Pat. No. 3,806,463); partially hydrogenated terphenyls; high-boiling straight or branched chain hydrocarbons; and mixtures of the above.

The following examples are given to illustrate some of the features of the present invention and should not be considered as limiting. In these examples all parts or proportions are by weight and all measurements are in the metric systems, unless otherwise stated.

The principles, preferred embodiments, and modes of operation of the present invention have been described in the foregoing specification. The invention which is intended to be protected herein, however, is not to be construed as limited to the particular forms disclosed, since these are to be regarded as illustrative rather than restrictive. Variations and changes can be made by those skilled in the art without departing from the spirit and scope of the invention.

EXAMPLE 1

Preparation of First Set of Microcapsules (A)

| Internal Phase (IP) |
| --- |
| 50.00 g Trimethylolpropanetriacrylate (TMPTA) Monomer |
| 1.50 g Crystal Violet Lactone (CVL) |
| 0.50 g Michler's Ketone |
| 1.25 g Benzoin Methyl Ether |

Combine the above, heat to dissolve, then cool to about 40° C.

| External Phase (EP) | | |
| --- | --- | --- |
| 40.0 g | 10% EMA—31 (Monsanto) Solution | Copolymer of ethylene and maleic anhydrides U.S. 4,001,140 |
| 110.0 g | Water | |

Adjust pH to 4.0 with 20% NaOH.
Add 10 g Cymel 385 (American Cyanamid). Etherified methylol melamine oligomer Place EP in blender cup and with agitation, add IP. Increase blender speed to achieve small drop size emulsion (50% of oil drop volume average approximately of 3u diameter). Transfer emulsion to water bath at 60° C. and process several hours to encapsulate.

Preparation of Second Set of Microcapsules (B)

These capsules are prepared like the first set, except for the IP components:

Internal Phase (IP)

25.0 g Sure Sol 290, sec-butylbiphenyl solvent
25.0 g Norpar 13, n-paraffin $C_{13}$ solvent
2.5 g PSD-O (Shin Nisso Kako Co., Ltd.) (orange dye) 3'-chloro-6'-(N-cyclohexylamino flouran)

Preparation of Resin Grind (C)

90.0 g #32420 Resin (Durex), phenolic resin
10.0 g Tamol 731 (Rohm and Haas) (25%), surfactant
150.0 g Water
Grind in attritor to approximately 10u and smaller.

Coating Preparation

Combine:
  2.0 Parts Capsule Dispersion (A)
  1.7 Parts Capsule Dispersion (B)
  2.0 Parts Resin Grind (C)
  5.0 Parts 5% Aqueous Solution of Vinol 540 (Airco), polyvinyl alcohol
Coat with #6 wire would rod on paper and dry.

Upon application of pressure (by writing instrument, typewriter, or blunt object) a black mark formed. Thereafter the sheet and coating were exposed to U.V. to polymerize the first set of microcapsules [approximately 5 sec. to two 15 watt GE bulbs (F15T8-BLB)].

Upon subsequent applicatin of pressure (by writing instrument, typewriter, or blunt object) an orange mark formed at the point of pressure application. The original black images were retained and therefore identifiable as first in time.

EXAMPLE II

This example is similar to Example I, except the original marks are purple. After exposing to U.V. top olymerize, subsequent marks are red color.

Preparation of First Set of Microcapsules (D)

These are prepared like (A), except the IP consists of:
50.00 g TMPTA Monomer
3.00 g Tetraethyl CVL, (3,3-bis(4-diethylaminophenyl)-6-dimethylaminophthalide)
0.75 g 2-Chlorothioxanthone, (photoinitiator)

Preparation of Second Set of Microcapsules (E)

These are prepared like (A), except the IP consists of:
25.0 g Sure Sol 290
25.0 g Norpar 13
2.5 g I6B (Ciba Geigy), red dye, 3,3-bis(1-octyl-1-methyl indol-3yl) phthalide Coating Preparation Combine:
2 Parts Capsule Dispersion (D)
2 Parts Capsule Dispersion (E)
2 Parts Resin Grind (C)
5 Parts 5% Aqueous Solution of Vino. 540 (Airco)
Coat with #6 wire wound rod on paper and dry.

EXAMPLE III

Because of self-marking characteristics, it may be desirable to prepare the coatings as two separate layers, where the top coating provides some anti-smudging protection for the capsules.

Capsule slurries from Example I are utilized for the first down layer:
Combine
2.0 Parts Capsule Dispersion (A)
1.7 Parts Capsule Dispersion (B)
3.0 Parts 5% Aqueous Solution or Vinol 540 (Airco)
Coat with #6 wire wound rod on paper and dry.

A top coat of the following formulation is then applied using a wire wound rod:

| Component | Wet Parts | Dry Parts |
| --- | --- | --- |
| Resin Grind (C) | 36 | 13 |
| Clay, HT Kaolin Slurry | 100 | 70 |
| Styrenebutadiene, Dow 620 Latex | 16 | 8 |
| Hydrolyzed ethyl ether derivative of corn starch, Penford Gum 230, (Penick & Ford) | 90 | 9 |
| | 242 | 100 |

Combine and add sufficient water (158 parts) for 25% total solids dispersion.

The resultant coating is less sensitive to inadvertent marring, but still provides black marking prior to U.V. exposure and orange marking after exposure.

What is claimed:

1. An improved self-contained pressure-sensitive record material having tamper resistance, said self-contained record material being of the type having a substrate, a coating on said substrate comprising in acidic developer material and a first set of microcapsules containing a first color former capable of expressing a first color, wherein the improvement comprises in addition a second set of microcapsules in combination with the first set of microcapsules, the second set of microcapsules containing a second color former and a photosensitive composition internal thereof which second set of microcapsules undergo a change in viscosity upon exposure to actinic radiation and which second color former is capable of expressing a color different from the color of the first color former in the first set of microcapsules, wherein the first set of microcapsules does not contain any photosensitive composition and said color formers are compounds which are not substantially decomposed by light.

2. The improved self-contained record material according to claim 1 wherein the second set of microcapsules is interspersed with the first set of microcapsules.

3. The improved self-contained record material according to claim 1 wherein the acidic developer is coated as a layer over a layer containing the first and second set of microcapsules.

4. The self-contained record material according to claim 1 wherein the first color former expressing a first color is a mixture of color formers expressing a color which is a composite thereof.

5. The self-contained record material according to claim 4 wherein the second color former is selected from one color former of the mixture of color formers.

6. The self-contained record maerial according to claim 1 wherein the second color former expressing a color is a mixture of color formers expressing a color which is a composite thereof.

7. The self-contained record material according to claim 1 wherein the photo sensitive composition is the combination of Michler's Ketone and benzoin methyl ether.

8. The self contained record material of claim 1 wherein the developer material is selected from the group consisting of treated clays, derivatives of aromatic carboxylic acids and metal salts thereof, phenolformaldehyde polymers and metal modified phenolic resin.

9. The record material of claim 1 in which the color formers are each selected from one or more of the group consisting of 3-diethylamino-6-methyl-7-anilinofluoran; 7-(1-ethyl-2-methylindol-3-yl)-7-(4-diethyolamino-2-ethozyphenyl)-5,7-dihydrofuro[3,4-b]pyridin-5-one; 3-diethylamino-7-(2-chloroanilino)-fluoran; 3-(N-methylcyclohexylamino)-6-methyl-7-anilinofluoran; 7-(1-octyl-2-methylindol-3-yl)--7-(4-diethylamino-2-ethoxypheny;)-5,7-dihydrofuro[3,4-b]pyridin-5-one; 3'-phenyl-7-dibenzylamino-2,2'-spiro-di-[2-H-1-benzopyran]; 3-dibutylamino-6-methyl-7-anilinofluoran; 3-(N-ethyl-N-tetrahydrofurfurylamino)-6-methyl-7-anilinofluoran; 3-di-butylamino-7-(2-chloroanilino)fluoran; 3,3-bis(4-dimethylamino-phenyl)-6-dimethylaminophthalide; 7-(1-ethyl-2-methylindol-3-yl)-7-(4-diethylamino-2-ethoxyphenyl)-5,7-dihydrofuro,[3,4-b]pyridine-5-one; 3,5',6-tris(dimethylamino)spiro[9H-fluorene-9,1'(3'H)-isobenzofuran]3'-one; 3'-chloro-6'-(N-cyclohexylamino)fluoran; and 3,3-bis(1-octyl-1-methylindol-3-yl)phthalide.

* * * * *